(12) United States Patent
Hur et al.

(10) Patent No.: US 9,344,038 B2
(45) Date of Patent: May 17, 2016

(54) TRI-PHASE DIGITAL POLAR MODULATOR

(71) Applicant: QUALCOMM Incorporated, San Diego, CA (US)

(72) Inventors: Joonhoi Hur, San Diego, CA (US); Paul Joseph Draxler, San Diego, CA (US); Jeremy Darren Dunworth, San Diego, CA (US); Peter D Heidmann, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/175,111

(22) Filed: Feb. 7, 2014

(65) Prior Publication Data
US 2015/0229272 A1   Aug. 13, 2015

(51) Int. Cl.
*H03C 7/02* (2006.01)
*H04L 27/22* (2006.01)
*H04L 27/36* (2006.01)

(52) U.S. Cl.
CPC ............... *H03C 7/025* (2013.01); *H04L 27/22* (2013.01); *H04L 27/361* (2013.01)

(58) Field of Classification Search
CPC ...... H04B 14/006; H04L 27/18; H04L 27/20; H03C 7/025; H03C 7/00
See application file for complete search history.

(56) References Cited

U.S. PATENT DOCUMENTS

| 2,852,606 | A | * | 9/1958 | Curry ............................. 370/203 |
| 3,821,481 | A | * | 6/1974 | Melvin ..................... H04L 5/12 370/206 |
| 4,213,094 | A | * | 7/1980 | Wood ............................. 370/215 |
| 4,406,009 | A | * | 9/1983 | Lender .................... H04L 27/02 375/263 |
| 4,804,931 | A | | 2/1989 | Hulick |
| 5,798,996 | A | * | 8/1998 | Arai ........................... 369/59.24 |
| 5,847,619 | A | * | 12/1998 | Kirisawa ....................... 332/103 |
| 6,531,935 | B1 | * | 3/2003 | Russat et al. .................. 333/139 |
| 7,256,649 | B2 | * | 8/2007 | Ksienski et al. .......... 330/124 R |
| 7,933,359 | B2 | | 4/2011 | Lee et al. |
| 8,169,272 | B2 | | 5/2012 | Chen et al. |
| 8,385,469 | B2 | | 2/2013 | Wang et al. |

(Continued)

FOREIGN PATENT DOCUMENTS

| EP | 0725478 A1 | 8/1996 |
| EP | 0828385 A2 | 3/1998 |

(Continued)

OTHER PUBLICATIONS

Jung I-S., et al., "A CMOS Low-Power Digital Polar Modulator System Integration for WCDMA Transmitter", IEEE Transactions on Industrial Electronics, May 15, 2011, pp. 1-8.

(Continued)

*Primary Examiner* — Jean B Corrielus
(74) *Attorney, Agent, or Firm* — Fountainhead Law Group P.C.

(57) ABSTRACT

Exemplary embodiments are related to a tri-phase digital polar modulator. A device may include a modulator configured to generate a primary phase modulated signal including the most significant bits (MSBs) of a modulated signal, a leading phase modulated signal including a first least significant bits (LSB) of the modulated signal, and a lagging phase modulated signal including a second LSB of the modulated signal. The device may also include a combination unit configured to add the primary phase modulated signal, the leading phase modulated signal, and the lagging phase modulated signal.

33 Claims, 11 Drawing Sheets

(56) References Cited

U.S. PATENT DOCUMENTS

| | | |
|---|---|---|
| 8,508,309 B2 | 8/2013 | McCune, Jr. |
| 8,547,177 B1 | 10/2013 | Yoo et al. |
| 8,571,498 B2 | 10/2013 | Khlat |
| 8,964,881 B2 | 2/2015 | Goswami |
| 2005/0134396 A1 | 6/2005 | Pehlke et al. |
| 2007/0247239 A1 | 10/2007 | Maunuksela et al. |
| 2008/0310200 A1* | 12/2008 | Maksimovic ....... H02M 3/1584 363/65 |
| 2010/0120381 A1* | 5/2010 | Chiu et al. ............ 455/113 |
| 2011/0204987 A1* | 8/2011 | Olsson .................. 332/104 |
| 2012/0062331 A1* | 3/2012 | Ravi et al. ............ 332/144 |
| 2014/0077876 A1 | 3/2014 | Feygin et al. |
| 2014/0125412 A1 | 5/2014 | Dawson et al. |
| 2014/0218104 A1 | 8/2014 | Kunihiro |
| 2015/0048892 A1 | 2/2015 | Boles et al. |
| 2015/0050030 A1* | 2/2015 | Le Taillandier De Gabory .................. 398/183 |

FOREIGN PATENT DOCUMENTS

| | | |
|---|---|---|
| WO | 0035160 A1 | 6/2000 |
| WO | 0038388 A1 | 6/2000 |
| WO | 2013042754 A1 | 3/2013 |

OTHER PUBLICATIONS

Kavousian A., et al., "A Digitally Modulated Polar CMOS Power Amplifier with a 20-MHz channel BandWidth", IEEE Journal of Solid-State Circuits, vol. 43, No. 10, Oct. 2008, pp. 2151-2158.

Yoo S-M., et al., "A Switched-Capacitor Power Amplifier for EER/Polar Transmitters", 2011 IEEE International Solid-State Circuits Conference, Feb. 23, 2011, pp. 428-430.

International Search Report and Written Opinion—PCT/US2015/014916—ISA/EPO—May 4, 2015.

Jin H., et al., "Efficient Digital Quadrature Transmitter Based on IQ Cell Sharing", IEEE International Solid-State Circuits Conference, Feb. 24, 2015, pp. 1-39.

Yoo S-M., et al., "A Class-G Switched-Capacitor RF Power Amplifier", IEEE Journal of Solid-State Circuits, May 2013, vol. 48, No. 5, pp. 1212-1224.

Yoo S-M., et al., "A Switched-Capacitor RF Power Amplifier", IEEE Journal of Solid-State Circuits, Dec. 2011, vol. 46, No. 12, pp. 2977-2987.

Yuan W., et al., "A Quadrature Switched Capacitor Power Amplifier in 65nm CMOS", IEEE Radio Frequency Integrated Circuits Symposium (RFIC), May 2015, pp. 135-138.

\* cited by examiner

TRI-PHASE DIGITAL POLAR MODULATOR

BACKGROUND

1. Field

The present invention relates generally to power amplifiers of a radio-frequency device. More specifically, the present invention relates to embodiments for a power amplifier including tri-phase digital polar modulator.

2. Background

A wireless communication device (e.g., a cellular phone, a smart phone, a USB modem, a tablet, a communication module, a Bluetooth headset, a wireless LAN radio, etc.) in a wireless communication system may transmit and receive data for two-way communication. The wireless communication device may include a transmitter for data transmission and a receiver for data reception. For data transmission, the transmitter may modulate a radio-frequency (RF) carrier signal with data to obtain a modulated signal, amplify the modulated signal to obtain an output RF signal having the proper output power level, and transmit the output RF signal via an antenna to a base station. For data reception, the receiver may obtain a received RF signal via the antenna and may condition and process the received RF signal to recover data sent by the base station.

The transmitter may include various circuits such as a power amplifier, a filter, etc. Power amplifiers are widely used to provide amplification and output drive for RF signals prior to transmission over the air. For example, power amplifiers are used in Global System for Mobile Communications (GSM) systems, Wideband Code Division Multiple Access (WCDMA) systems, etc. Power amplifiers are also used in base stations as well as in terminals.

When using a digital polar structure for a high efficiency power amplifier, issues with achieving fine resolution values in the in-phase and quadrature (IQ) plane may exist. For example, when there are too few bits of resolution, the signal fidelity suffers degradation, for example through degraded output spectral emissions. Additional challenges in digital polar structures are associated with the mismatch effects caused by practical implementation and layout and their impact on combining efficiency and gain distortion over the range of digital word states. Further additional challenges in polar power amplifiers are encountered due to increasingly stringent delay requirements between amplitude and phase path needed to meet output waveform specifications as the bandwidth of the RF signal increases.

DETAILED DESCRIPTION

Figure 1:
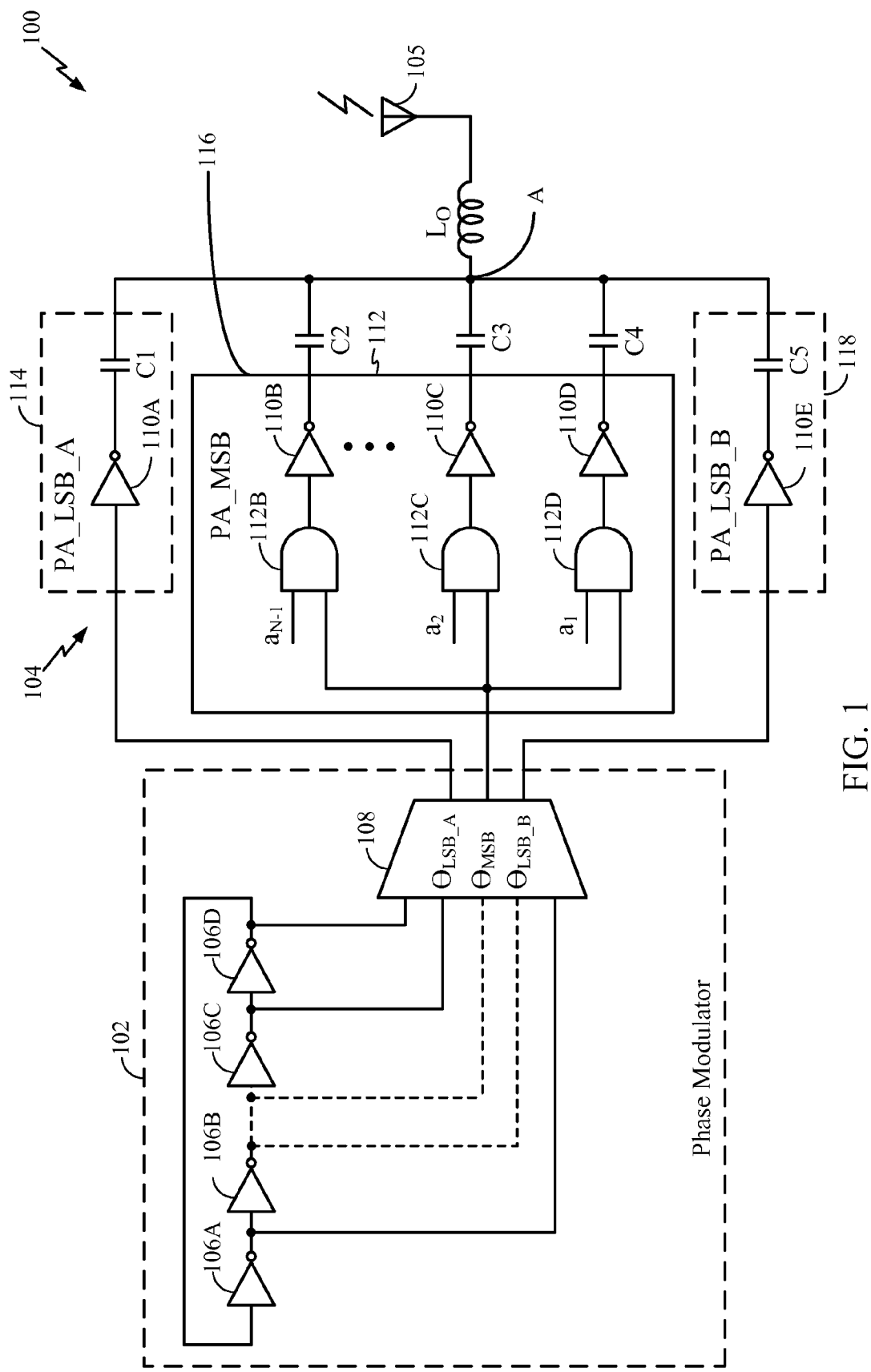
FIG. 1 depicts a device, in accordance with an exemplary embodiment of the present invention.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As will be appreciated by a person having ordinary skill in the art, conventional digital polar structures may exhibit limited efficiency and output impedance variation. Further, conventional digital polar structures, such as switching capacitor (SWCAP) digital polar structures, may require multiple power cells for high resolution, and experience issues with layout area and device and parasitic matching across relatively large distances. In addition, layout parasitic issues may result in a decrease in efficiency with high resolutions. Further, an outphasing, or linear amplification using nonlinear components (LINC), power amplifier may exhibit low power combining efficiency and may be overly sensitive to mismatches.

According to an exemplary embodiment, the present invention includes a device including a modulator configured to generate a primary phase modulated signal including the most significant bits (MSBs) of a modulated signal, a leading phase modulated signal including a first least significant bits (LSB) of the modulated signal, and a lagging phase modulated signal including a second LSB of the modulated signal. The device may further include a combination unit configured to add the primary phase modulated signal, the leading phase modulated signal, and the lagging phase modulated signal.

According to another exemplary embodiment, the present invention includes methods for operating a tri-phase digital polar modulator. Various embodiments of such a method may include generating a primary phase modulated signal including the most significant bits (MSBs) of a signal. The method may also include generating a leading phase modulated signal including a first least significant bit (LSB) of the signal and generating a lagging phase modulated signal including a second LSB of the signal. The method may also include combining at least one bit of the primary phase modulated signal, the leading phase modulated signal, and the lagging phase modulated signal to generate an output signal Other aspects, as well as features and advantages of various aspects, of the present invention will become apparent to those of skill in the art through consideration of the ensuing description, the accompanying drawings and the appended claims.

According to an embodiment of the present invention, a center phase signal of a tri-phase digital polar amplifier may be used to drive the most significant bits (MSBs) of a signal. A phase signal may be a constant amplitude phase modulated signal. The two least significant bits (LSBs) of the signal may be driven with phase signals offset from the center phase signal. Stated another way, two additional phase signals may be offset from a primary phase modulated signal. One phase signal may lead the primary phase modulated signal and the other may lag the primary phase modulated signal, but not necessarily by the same amount. This may increase the resolution of a resulting waveform when compared to single-phase digital polar amplifiers. Further, this may refine the fine resolution, improving the output signal fidelity and spectral emissions.

FIG. 1 illustrates a device 100, in accordance with an exemplary embodiment of the present invention. Device 100 includes a phase modulator 102 and a combination unit 104 having an input coupled to an output of phase modulator 102. By way of example only, phase modulator 102 may comprise a digital phase modulator or an analog phase modulator. Device 100 may be configured for coupling to an antenna 105. An example digital phase modulator 102 includes a plurality of inverters 106A-106D coupled to a multiplexer 108, which is configured for selecting and conveying three phases to combination unit 104. As will be understood by a person having ordinary skill in the art, phase modulator 102 can be realized with any number of inverters. An example combination unit 104 includes a plurality of capacitors C1-C5, a plurality of inverters 110A-110E, and a plurality of NAND gates 112B-112D. More specifically, combination unit 104 includes a first path (i.e., including inverter 110A and capacitor C1) for receiving a leading LSB signal from multiplexer 108 and a second path (i.e., including inverter 110E and capacitor C5) for receiving a lagging LSB signal from multiplexer 108. In addition, combination unit 104 includes a plurality of paths (i.e., paths including NAND gates 112 and inverters 110) for receiving primary phase MSB signal from multiplexer 108. Device 100 may further include an inductor Lo and antenna 105. Further, device 100 may include a filter, a matching network or other front end components such as antenna switches and diplexers (not shown in FIG. 1). For example, a SAW filter or Duplexer filter may be coupled between inductor Lo and antenna 105.

As illustrated in FIG. 1, one output of multiplexer 108 is coupled to an input of inverter 110A, which further includes an output coupled to capacitor C1. Capacitor C1 is also coupled to a node A, which is coupled to antenna 105 via inductor $L_o$. By way of example only, capacitor C1 may have a capacitance value of $C_o/2^N$, wherein $C_o$ is approximately resonant with Lo at the desired transmit frequency and N is equal to the number of paths configured to receive the primary phase MSB signal via multiplexer 108.

Another output of multiplexer 108 is coupled to one input of each of NAND gates 112B-112D. NAND gate 112B includes another input configured to receive a select signal $a_{N-1}$. An output of NAND gate 112B is coupled to inverter 110B, which is further coupled to capacitor C2. Capacitor C2, which, by way of example only, may have a capacitance value of $2^{N-1}*Co/2^N$, is also coupled to node A. In addition to including an input coupled to an output of multiplexer 105, NAND gate 112C includes another input configured to receive a select signal $a_2$. An output of NAND gate 112C is coupled to inverter 110C, which is further coupled to capacitor C3. Capacitor C3 is further coupled to node A and may have a capacitance value of, for example only, $4*Co/2^N$. Similarly, NAND gate 112D includes another input configured to receive a select signal $a_1$. An output of NAND gate 112D is coupled to inverter 110D, which is further coupled to capacitor C4. Capacitor C4 is also coupled to node A. By way of example only, capacitor C4 may have a capacitance value of $2*Co/2^N$.

In addition, another output of multiplexer 108 is coupled to an input of inverter 110E, which further includes an output coupled to capacitor C5. Capacitor C5, which, by way of example only, may have a capacitance value of $C_o/2^N$, is also coupled to node A. As will be appreciated by a person having ordinary skill in the art, select signals $a_{N-1}$, $a_2$, and $a_1$ may be asserted for selectively turning on an associated path. It is noted that the paths configured to receive the lagging and leading LSBs may be enabled at all times during operation, and one or more paths configured to receive the primary phase MSB signal may be selectively enabled (i.e., via select signals $a_{N-1}$, $a_2$, and $a_1$).

According to one exemplary embodiment, multiplexer 108 may be configured to simultaneously output the leading LSB signal (i.e., least significant bit (LSB_A)) to an offset phase unit 114, the primary phase MSB signal (i.e., most significant bit (MSB)) to a center phase unit 116, and the lagging LSB signal (i.e., least significant bit (LSB_B)) to an offset phase unit 118. It is noted that although center phase unit 116 is illustrated as having three paths, center phase unit 116 may include any number of paths. It is further noted that although multiplexer 108 is shown as having more than five inputs, it may have any number of inputs and typically would have a large number of inputs to provide a fine resolution of phase.

Further, device 100 may be configured to generate a resulting waveform at node A by adding the leading phase modulated signal (i.e., the signal conveyed via inverter 110A and capacitor C1), the primary phase modulated signal (the signals conveyed via one of more of inverters 110B-D and capacitors C2-C4), and the lagging phase modulated signal (i.e., the signal conveyed via inverter 110E and capacitor C5). Stated another way, combination unit 104 may be configured to add the leading phase modulated signal, the primary phase modulated signal, and the lagging phase modulated signal to generate a waveform to be conveyed via antenna 105. It is noted that although device 100 may be configured for utilizing a switching capacitor combination technology to combine the leading phase modulated signal, the primary phase modulated signal, and the lagging phase modulated signal, the present invention is not so limited. Rather, the present invention may utilize other suitable and known combination technologies.

Figure 2:
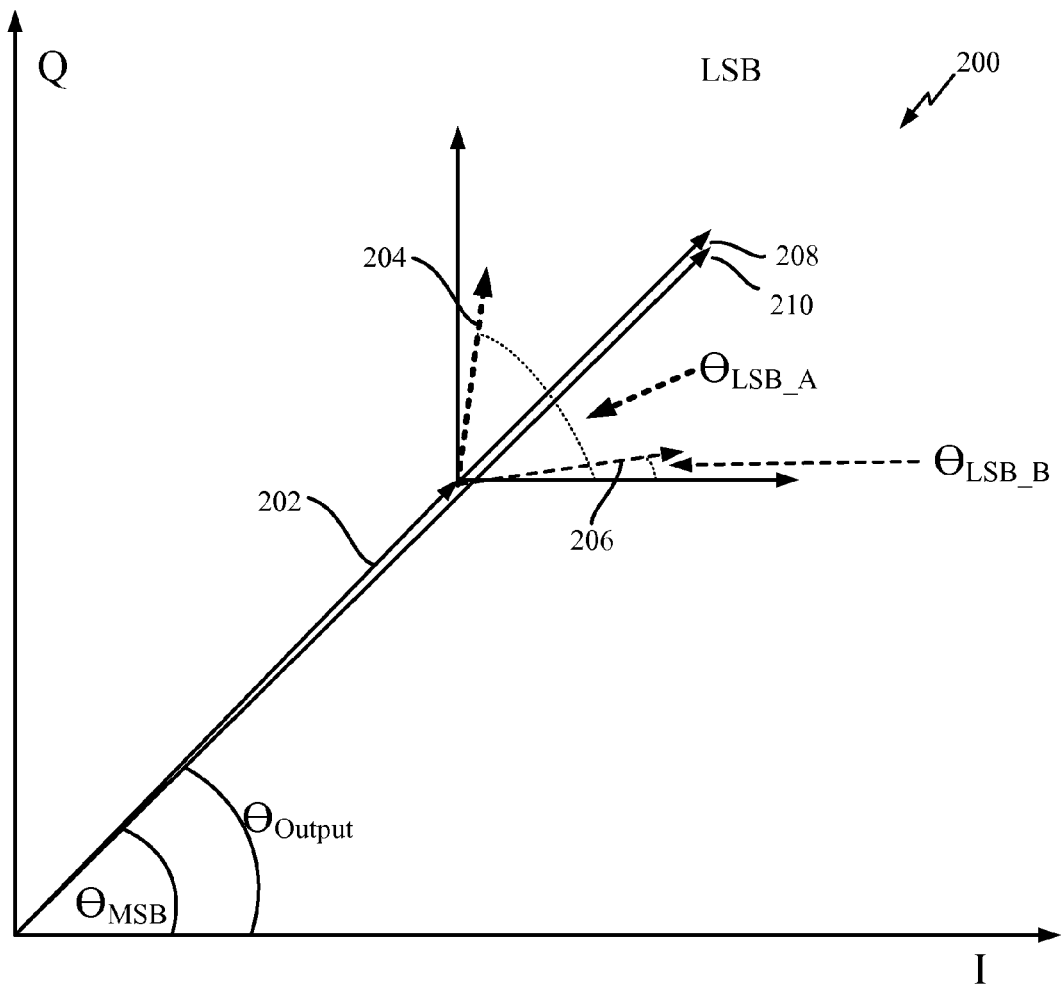
FIG. 2 is a plot illustrating a decomposed output signal for a tri-phase modulator in an in-phase and quadrature plane with equal phase offsets, according to an exemplary embodiment of the present invention.

FIG. 2 is a plot 200 of an in-phase and quadrature (IQ) plane. Plot 200 includes an arrow 202 representing a magnitude of the primary phase signal (i.e., the MSB) and angle $\theta_{MSB}$ representing the phase of the primary phase signal. Further, an arrow 204 represents a magnitude of the leading phase signal (i.e., rotated a bit more than the primary phase signal) and angle $\theta_{LSB\_A}$ represents the phase of the leading phase signal. Plot 200 further includes an arrow 206 representing a magnitude of the lagging phase signal (i.e., rotated a bit less than the primary phase signal) and an angle $\theta_{LSB\_B}$ representing the phase of the lagging phase signal. In this example, the phase offset between LSB_A and MSB can be the same as the phase offset between MSB and LSB_B signal.

The leading phase and the lagging phase LSBs are added together to constructively interfere to produce a phase signal represented by arrow 208. Further, the primary phase signal (i.e., represented by arrow 202) and the signal represented by arrow 208 may be added together to generate the resulting output signal, which is represented by arrow 210 having a phase represented by an angle $\theta_{output}$. In FIG. 2, vector 208 and vector 210 are offset slightly to enhance the readability of FIG. 2. As will be appreciated by a person having ordinary skill in the art, in this exemplary embodiment, the offset of the leading phase signal is substantially equal to the offset of the lagging phase signal and, thus, the resulting output signal is co-linear with the primary phase signal.

Figure 3:
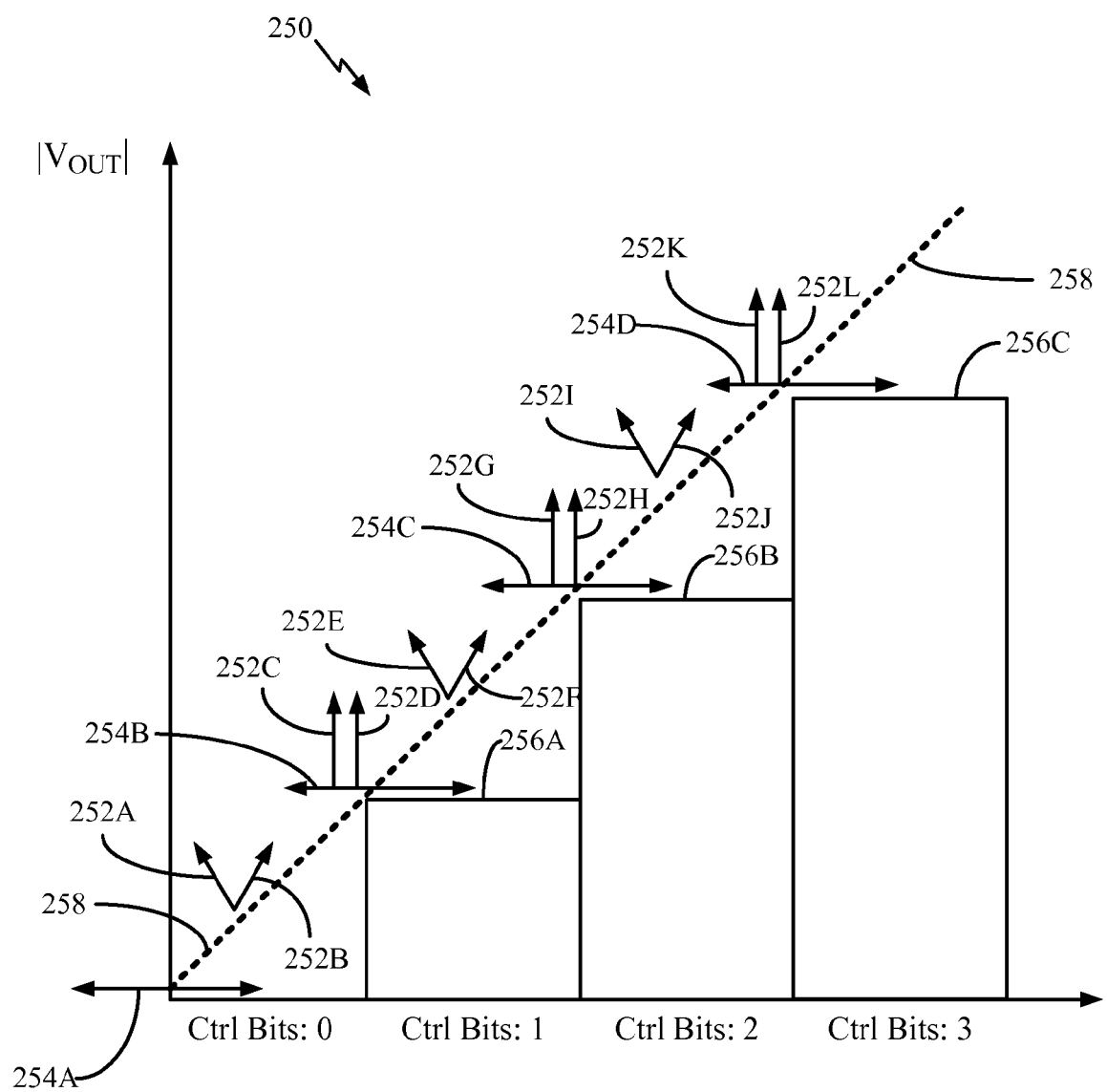
FIG. 3 is a plot illustrating generation of an output signal magnitude, according to an exemplary embodiment of the present invention.

FIG. 3 depicts a plot 250 including LSB representations, MSB representations, and output signal magnitude representations for an "equal phase offset" tri-phase modulation mode. Arrows 252A-252L represent LSBs with constructive interference and arrows 254A-254D represent LSBs with destructive interference. Dashed line 258 represents the output signal magnitudes and blocks 256A-256C represent MSBs. More specifically, at a point in time, a zero magnitude output signal 254A may be generated by a tri-phase digital polar modulator (e.g., tri-phase digital modulator 100). Due to the leading LSB and the lagging LSB being opposite and equal to one another, the two signals destructively interfere and, thus, no output signal is generated at this point. Further, moving along the output signal magnitude line 258, at a subsequent time, arrows 252A and 252B, which respectively represent a leading LSB and a lagging LSB, may be generated. Moving further along line 258, at a subsequent time, co-linear arrows 252C and 252D, which respectively represent a leading LSB and a lagging LSB, may be generated.

To move incrementally higher in output signal magnitude, MSB block, 256A is activated and the LSB are configured to destructively interfere as shown in 254B. Block 256A, which represents one control bit of the MSBs, is used to generate that range of output signal magnitudes. Again, moving along line 258, for higher output signal magnitude, arrows 252E and 252F, which respectively represent a leading LSB and a lagging LSB, may be generated. Moving further along line 258, for higher output signal magnitude, co-linear arrows 252G and 252H, which respectively represent a leading LSB and a lagging LSB, may be generated. Due to the leading LSB and the lagging LSB being co-linear, the two signals constructively interfere. At an incrementally higher output signal magnitude, a block 256B, which represents two control bits of the MSBs, is activated, and the LSBs are configured to with destructive interference. Moving along line 258, for a higher output signal magnitude, arrows 252I and 252J, which respectively represent a leading LSB and a lagging LSB, may be generated. Moving further along the output signal magnitude line 258, co-linear arrows 252K and 252L, which respectively represent a leading LSB and a lagging LSB, may be generated. Due to the leading LSB and the lagging LSB being co-linear, the two signals constructively interfere. At incrementally higher output signal magnitude, a block 256C, which represents three control bits of the MSBs, is activated. As will be understood by a person having ordinary skill in the art, control bits control the amplitude of the MSB phase signal contribution to the output signal magnitude. LSB signals 252A-252L and 254A-254D are shown for an MSB with an angle of 90 degrees. It should be understood that in actuality, the average angle of the two LSB signals may be equal to the angle of the MSB signal as in FIG. 2. To hit all of the points on the dashed line 258, a variety of lead-lag offset phases would be needed. The ensemble of these is denoted with the single images of 252A&B, 252E&F, 252I&J in FIG. 3. The phase resolution of the phase modulator sets the number of these values that can be achieved.

Figure 4:
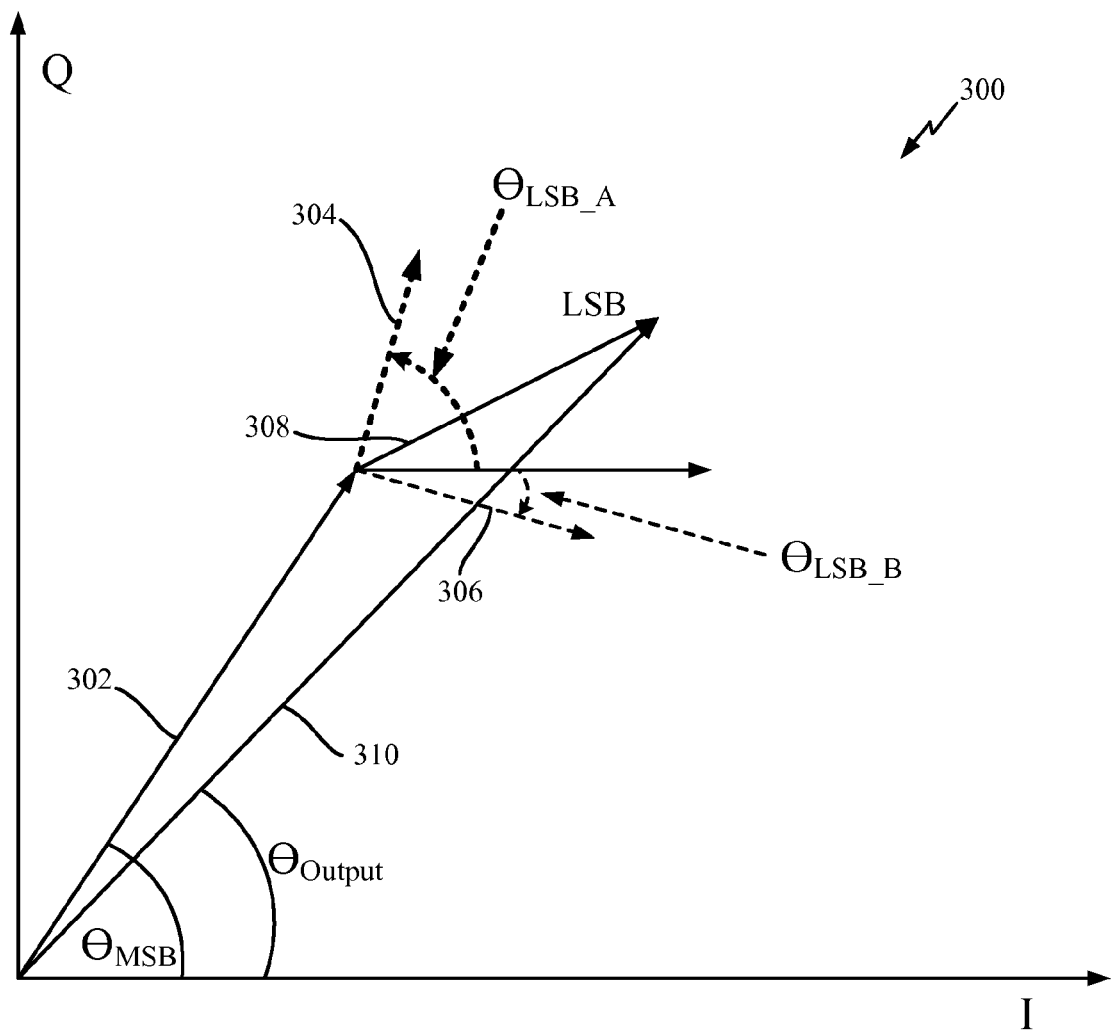
FIG. 4 is a plot illustrating a decomposed output signal for the tri-phase modulator in an in-phase and quadrature plane with different phase offsets, in accordance with an exemplary embodiment of the present invention.

FIG. 4 is a plot 300 of an IQ plane. Plot 300 includes an arrow 302 representing a magnitude of the primary phase signal (i.e., the MSB) and angle $\theta_{MSB}$ representing the phase of the primary phase signal. Further, an arrow 304 represents a magnitude of the leading phase signal (i.e., rotated a bit more than the primary phase signal) and angle $\theta_{LSB\_A}$ represents the phase of the leading phase signal. Plot 300 further includes an arrow 306 representing a magnitude of the lagging phase signal (i.e., rotated a bit less than the primary phase signal) and an angle $\theta_{LSB\_B}$ representing the phase of the lagging phase signal. In this embodiment, angle $\theta_{LSB\_A}$ and angle $\theta_{LSB\_A}$ are not equal to one another. This may further refine the fine resolution, thus, improving linearity. Further, this may allow for a decrease in phase modulator requirements for a given performance level.

The leading phase and the lagging phase LSBs are added together to constructively interfere to produce a phase signal represented by arrow 308. Further, the primary phase signal (i.e., represented by arrow 302) and the signal represented by arrow 308 are added together to generate the resulting output signal, which is represented by arrow 310 having a phase represented by an angle $\theta_{output}$. As will be appreciated by a person having ordinary skill in the art, the offset of the leading phase signal is not equal to the offset of the lagging phase signal and, thus, the resulting output signal is not co-linear with the primary phase signal.

Figure 5:
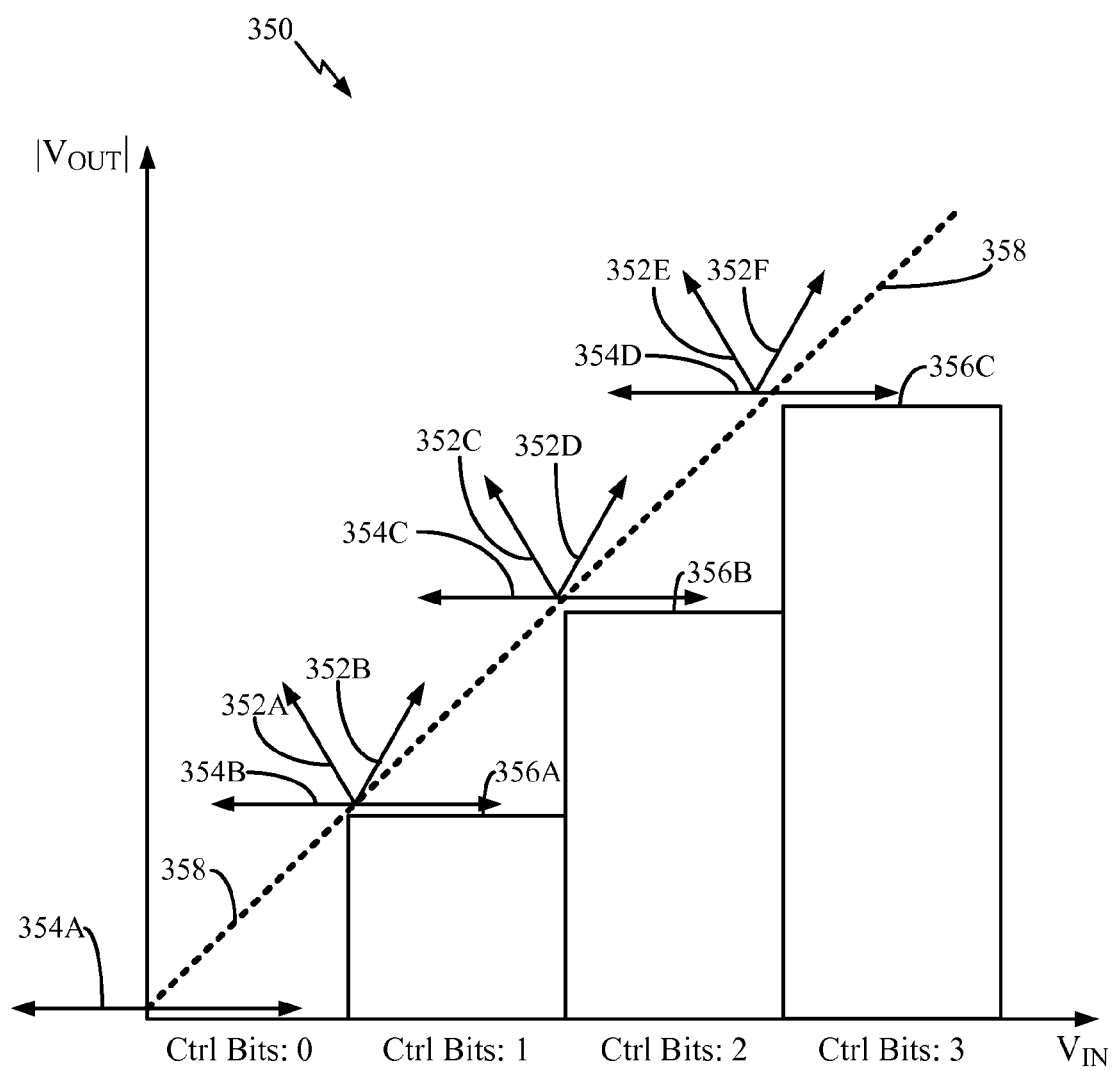
FIG. 5 is a plot illustrating generation of an output signal magnitude with an oversized least significant bit, in accordance with an exemplary embodiment of the present invention.

In accordance with another exemplary embodiment, oversized LSBs may be used to allow for hysteresis at transitions, less phase change, and less noise. It is noted that "oversized" may be defined as the maximum in-phase magnitude from LSBs being larger than the minimum MSBs. Accordingly, the sum of the LSB magnitude is larger than minimum MSB to minimize the phase difference between LSBs when MSB is changing. It is further noted that this embodiment may experience high LINC amplitude, decreased efficiency, and decreased output power. FIG. 5 depicts a plot 350 including LSB representations, MSB representations, and output signal magnitude representations for an "oversized LSB" tri-phase modulation mode. Arrows 352A-352F represent LSBs with constructive interference and arrows 354A-354D represent LSBs with destructive interference. Dashed line 358 represents the output signal magnitude and blocks 356A-356C represent MSBs. More specifically, at an initial point in time, a zero magnitude signal 354A may be generated by a tri-phase digital polar modulator (e.g., tri-phase digital modulator 100). Further, moving along line 358, at a subsequent time, arrows 352A and 352B represent LSBs including partial destructive interference and partial constructive interference, and arrow 354B represents LSBs with destructive interference. In addition, a block 356A, which represents one control bit of the MSBs, is generated.

Again, moving along line 358, at a subsequent time, arrows 352C and 352D represent LSBs including partial destructive interference and partial constructive interference, and arrow 354C represents LSBs with destructive interference In addition, a block 356B, which represents two control bits of the MSBs, is generated. Moving along line 358, at a subsequent time, arrows 352E and 352F represent LSBs including partial destructive interference and partial constructive interference, and arrow 354D represents LSBs with destructive interference. In addition, a block 356C, which represents three control bits of the MSBs, is generated. Oversized modulation may reduce the phase difference for LSBs, and phase bits may be reduced if a digital phase modulator is utilized.

Figure 6:
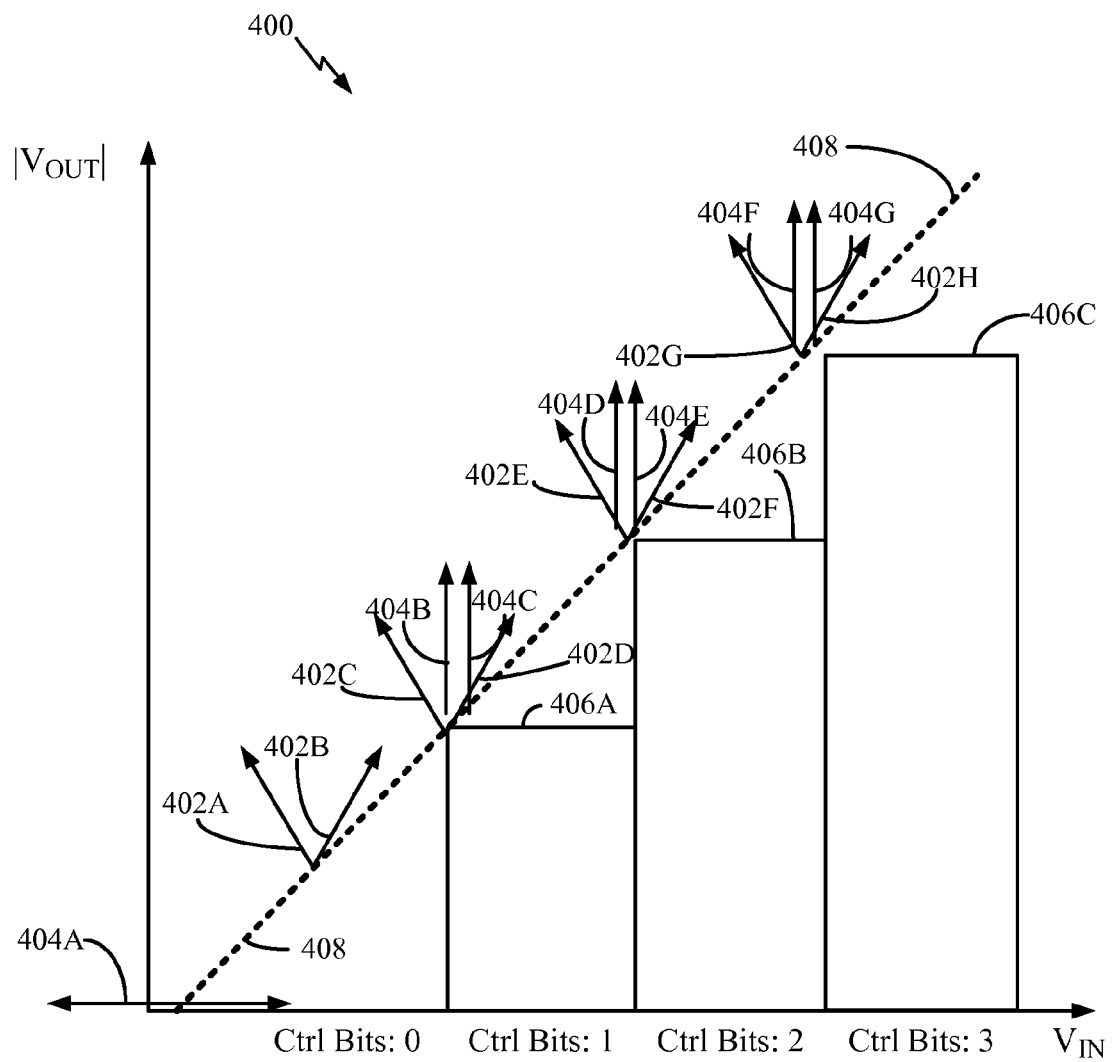
FIG. 6 is a plot illustrating generation of an output signal magnitude with an oversized least significant bit and amplitude offset, according to an exemplary embodiment of the present invention.

In accordance with another exemplary embodiment, oversized LSBs may be used, and a size of a first bit of the MSBs may be adjusted (i.e., the MSBs may have amplitude offset from the oversized LSBs). This embodiment may provide for less phase change, less noise, and increased efficiency. However, this embodiment may experience increased LINC amplitude. FIG. 6 depicts a plot 400 including LSB representations, MSB representations, and output signal magnitude representations for an "offset" tri-phase modulation mode, wherein LSBs may be oversized, and a size of a first bit of the MSBs may be adjusted (i.e., the MSBs may have amplitude offset from the oversized LSBs). Arrows 402A-402H represent LSBs with maximum constructive interference and arrows 404A-404D represent LSBs with some destructive interference and some constructive interference. Dashed line 408 represents the output signal magnitude and blocks 406A-406C represent MSBs. More specifically, at an initial point in time, a zero magnitude signal 404A may be generated by a tri-phase digital polar modulator (e.g., tri-phase digital modulator 100). Further, moving along line 408, at a subsequent time, arrows 402A and 402B represent LSBs including partial destructive interference and partial constructive interference. Moving along line 408, at a subsequent time, arrows 402C and 402D represent LSBs including partial destructive interference and partial constructive interference, and arrows 404B and 404C represents LSBs with constructive interference. In addition, a block 406A, which represents one control bit of the MSBs, is generated. Again, moving along line 408, at a subsequent time, arrows 402E and 402F represent LSBs including partial destructive interference and partial constructive interference, and arrows 404D and 404E represent LSBs with constructive interference. In addition, a block 406B, which represents two control bits of the MSBs, is generated. Moving along line 408, at a subsequent time, arrows 402G and 402H represent LSBs including partial destructive interference and partial constructive interference, and arrows 404F and 404G represents LSBs with constructive interference In addition, a block 406C, which represents three control bits of the MSBs, is generated.

Figure 7:
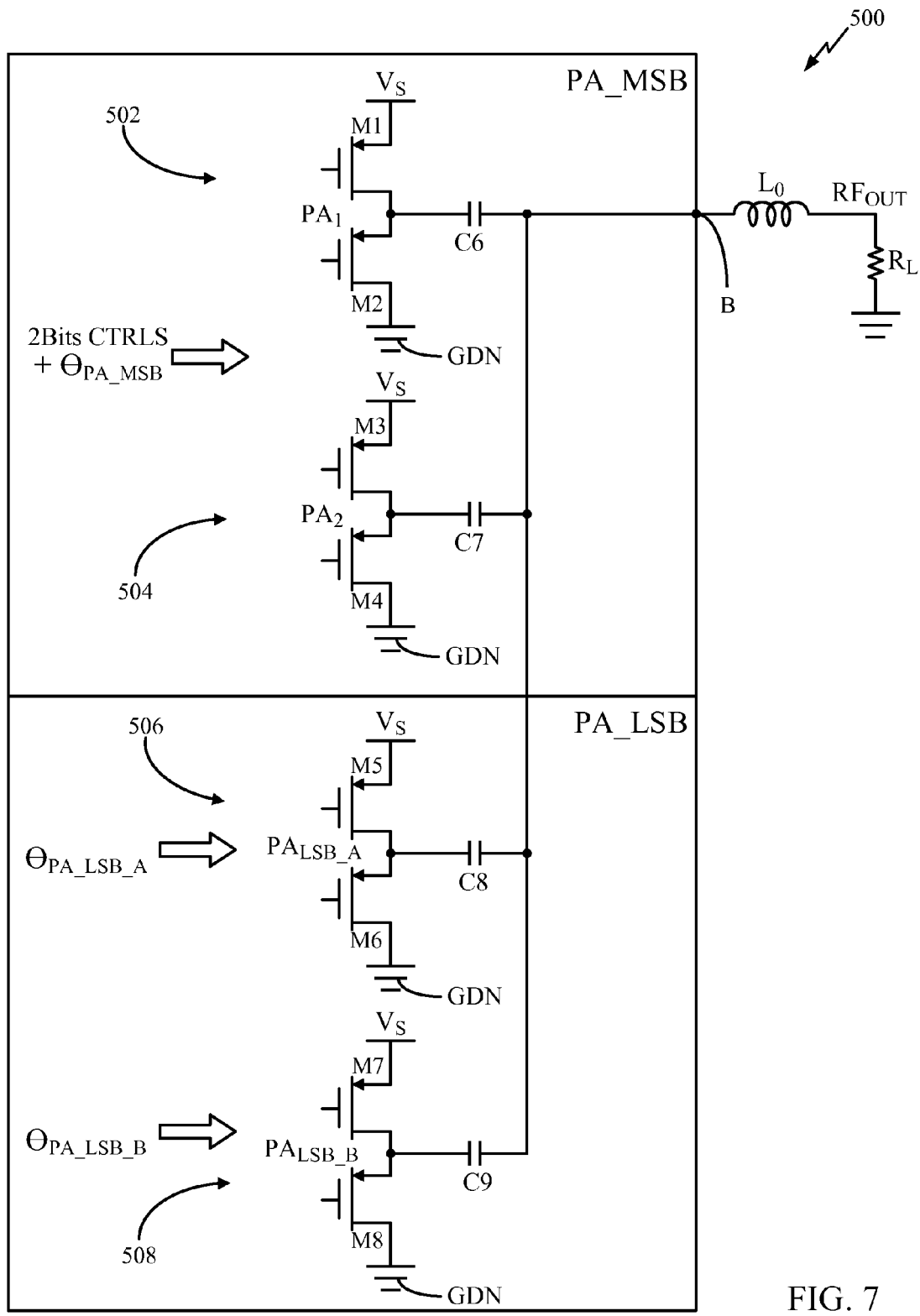
FIG. 7 illustrates a circuit diagram, according to an exemplary embodiment of the present invention.

FIG. 7 illustrates a circuit diagram 500, in accordance with an exemplary embodiment of the present invention. It is noted that circuit diagram 500 is provided a non-limiting example circuit diagram for carrying out various embodiments of the present invention, and other suitable circuit diagrams may be used. Circuit diagram 500 includes a first plurality of transistors 502 coupled between a supply voltage Vs and a ground voltage GND. More specifically, a source of a transistor M1 is coupled to supply voltage Vs and a drain of transistor M1 is coupled to a source of a transistor M2, which further includes a drain coupled to ground voltage GND. Further, circuit diagram 500 includes a capacitor C6 coupled between transistors M1 and M2 and a node B. Circuit diagram 500 further includes an inductor Lo coupled between node B and a resistor $R_L$, which is also coupled to ground voltage GND. By way of example only, capacitor C6 may comprise a capacitance of 2 pF and inductor Lo may have an inductance of 2.2 nH depending on an operation frequency. An output signal $RF_{OUT}$ may be conveyed across resistor $R_L$.

Circuit diagram 500 also includes a second plurality of transistors 504 coupled between a supply voltage Vs and a ground voltage GND. More specifically, a source of a transistor M3 is coupled to supply voltage Vs and a drain of transistor M3 is coupled to a source of a transistor M4, which further includes a drain coupled to ground voltage GND.

Further, circuit diagram 500 includes a capacitor C7 coupled between transistors M3 and M4 and node B. By way of example only, capacitor C7 may comprise a capacitance of 1 pF. It is noted that a primary MSB signal may be conveyed via transistors 502 and transistors 504.

Circuit diagram 500 also includes a third plurality of transistors 506 coupled between a supply voltage Vs and a ground voltage GND. More specifically, a source of a transistor M5 is coupled to supply voltage Vs and a drain of transistor M5 is coupled to a source of a transistor M6, which further includes a drain coupled to ground voltage GND. Further, circuit diagram 500 includes a capacitor C8 coupled between transistors M5 and M6 and node B. By way of example only, capacitor C8 may comprise a capacitance of 0.5 pF. It is noted that a leading LSB signal may be conveyed via transistors 506.

In addition, circuit diagram 500 includes a fourth plurality of transistors 508 coupled between a supply voltage Vs and a ground voltage GND. More specifically, a source of a transistor M7 is coupled to supply voltage Vs and a drain of transistor M7 is coupled to a source of a transistor M8, which further includes a drain coupled to ground voltage GND. Further, circuit diagram 500 includes a capacitor C9 coupled between transistors M7 and M8 and node B. By way of example only, capacitor C9 may comprise a capacitance of 0.5 pF. It is noted that a lagging LSB signal may be conveyed via transistors 508. For an oversized LSB embodiment, capacitor C8 and capacitor C9 may comprise a capacitance of alpha*0.5 pF, where alpha is the oversizing factor and is greater than 1.

Figure 8:
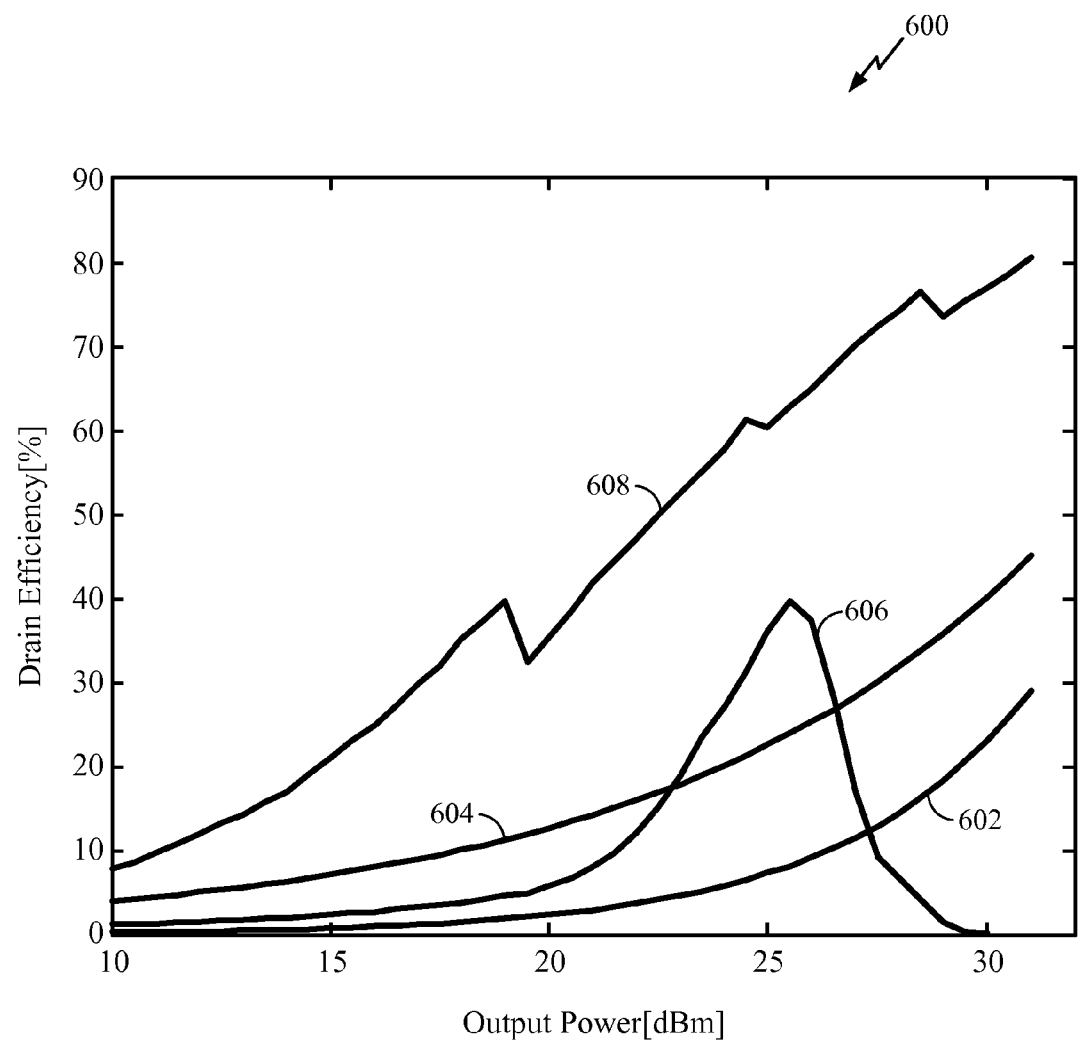
FIG. 8 is a plot illustrating drain efficiency versus instantaneous output power of various power amplifier technologies.

FIG. 8 depicts a plot 600 illustrating drain efficiency versus output power of various power amplifier technologies. A signal 602 represents drain efficiency versus output power for a class-A power amplifier and a signal 604 represents drain efficiency versus output power for a class-B power amplifier. Further, a signal 606 represents drain efficiency versus output power for a signal probability density function (PDF) at maximum output power, and a signal 608 represents a drain efficiency versus output power for a tri-phase digital polar power amplifier, such as device 100 illustrated in FIG. 1. As illustrated in plot 600, in comparison to other power amplifier technologies, the tri-phase digital polar power amplifier exhibits enhanced efficiency.

Figure 9:
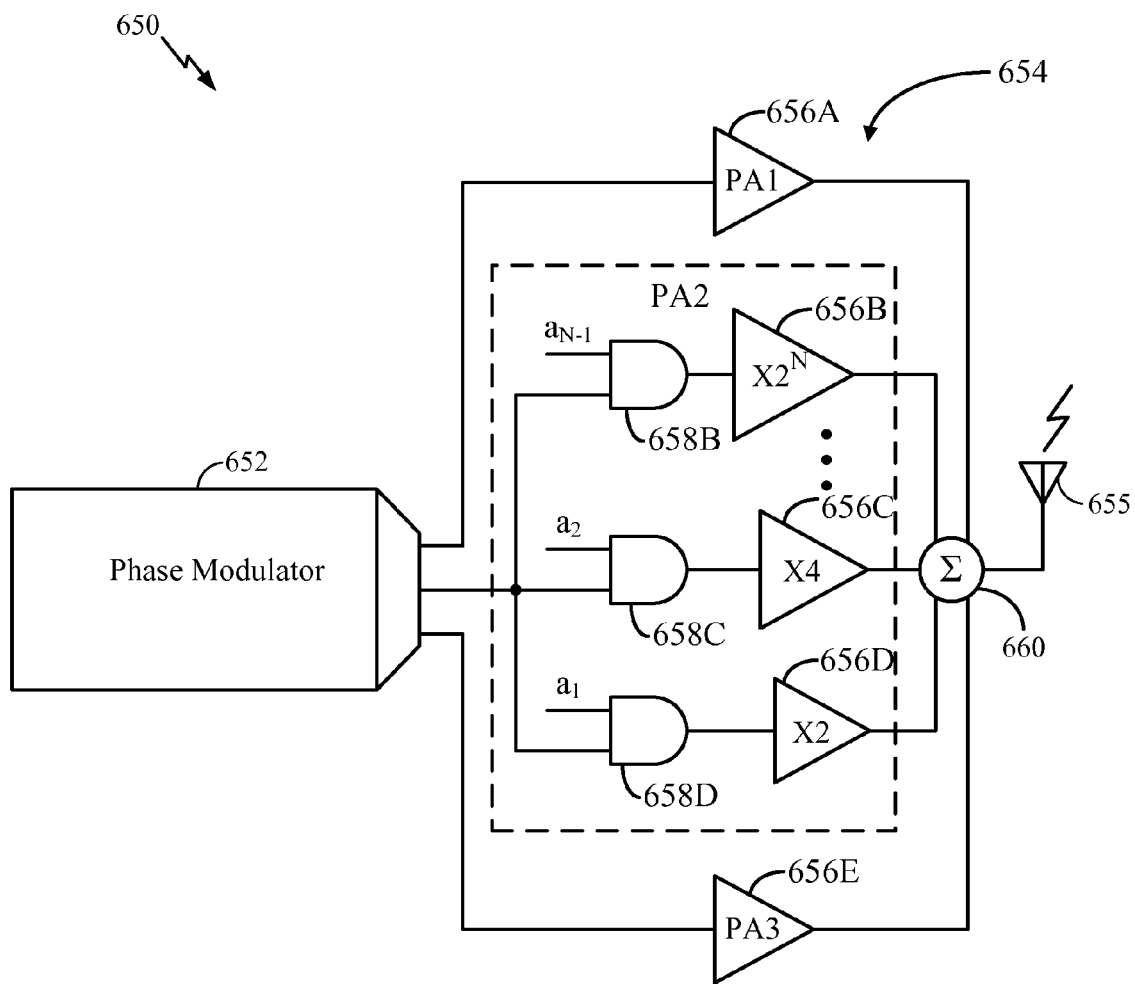
FIG. 9 illustrates a device, in accordance with an exemplary embodiment of the present invention.

FIG. 9 is a device 650, in accordance with an exemplary embodiment of the present invention. Device 650 includes a phase modulator 652 and a combination unit 654 having an input coupled to an output of phase modulator 652. By way of example only, phase modulator 652 may comprise a digital phase modulator, an analog phase modulator, an digital modulator with a phase interpolator, a sigma-delta phase modulator, or any combination thereof. Device 650 may be configured for coupling to an antenna 655. Phase modulator 652 may be configured for conveying three phases to combination unit 654. Combination unit 654 includes a plurality of digital power amplifiers 656A-656E, a plurality of NAND gates 658B-658D, and a power combiner 660. By way of example only, power combiner 660 may comprise any known and suitable power combiner, such as a Wilkinson power combiner, a hybrid, a capacitor array, an inductor array, quarter wave lines, or any combination thereof. Furthermore, device 650 may be configured to utilize one or more modulations techniques as described herein (i.e., even tri-phase mode, uneven tri-phase calibration mode, oversized LSB mode, oversized offset mode).

Figure 10:
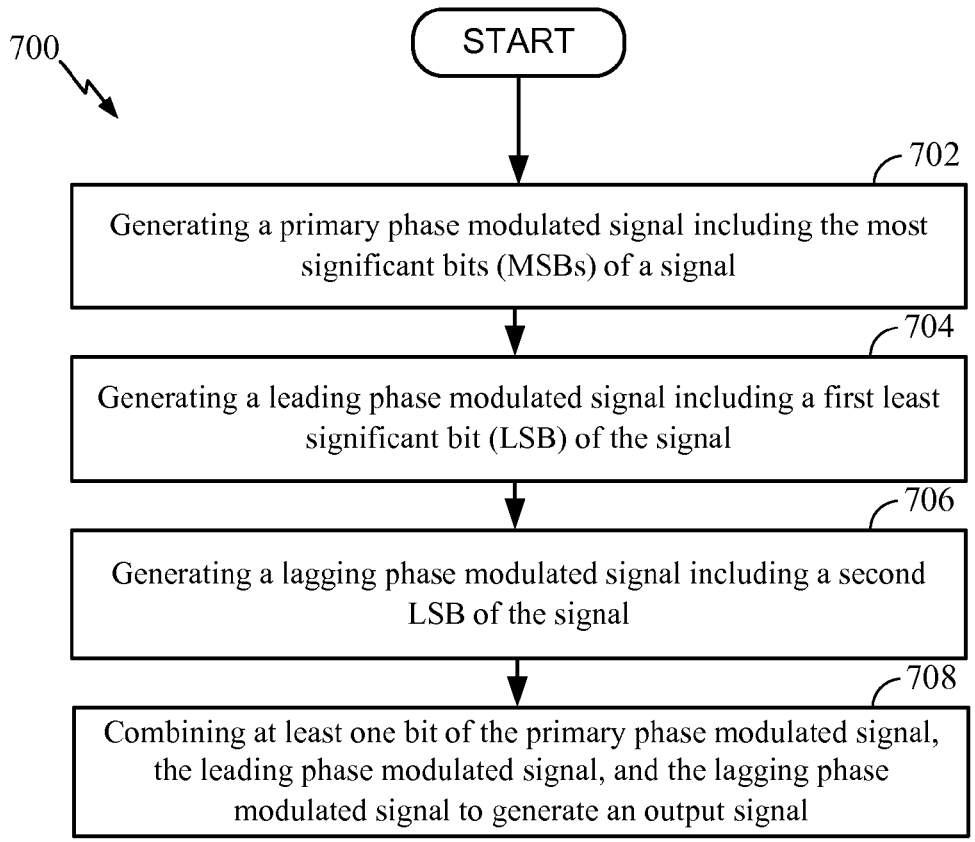
FIG. 10 is flowchart depicting a method, according to an exemplary embodiment of the present invention.

FIG. 10 is a flowchart illustrating a method 700, in accordance with one or more exemplary embodiments. Method 700 may include generating a primary phase modulated signal including the most significant bits (MSBs) of a signal (depicted by numeral 702). Method 700 may also include generating a leading phase modulated signal including a first least significant bit (LSB) of the signal (depicted by numeral 704). Further, method 700 may include generating a lagging phase modulated signal including a second LSB of the signal (depicted by numeral 706). Method 700 may also include combining at least one bit of the primary phase modulated signal, the leading phase modulated signal, and the lagging phase modulated signal to generate an output signal (depicted by numeral 708).

Figure 11:
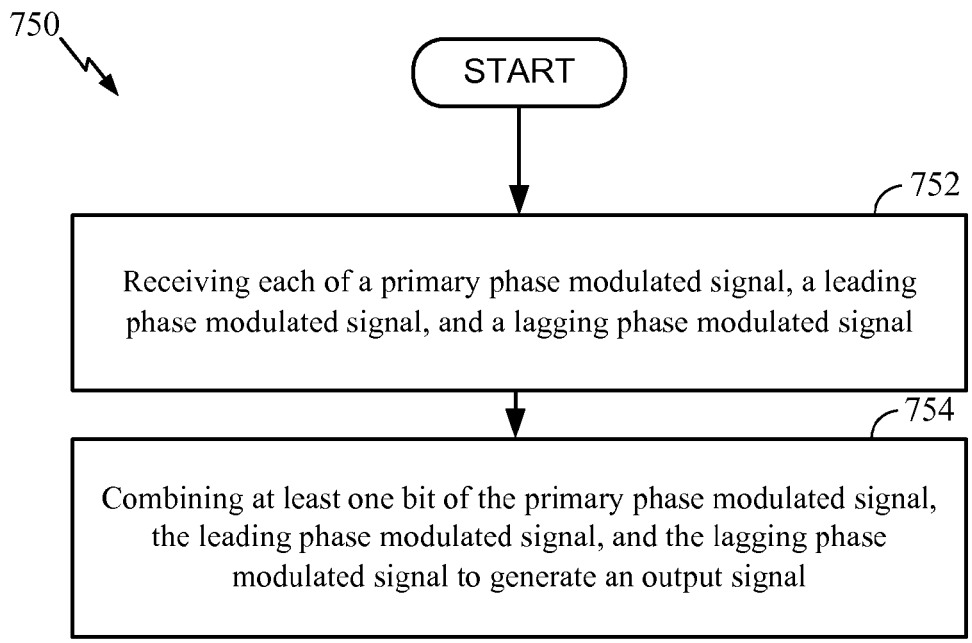
FIG. 11 is flowchart depicting another method, in accordance with an exemplary embodiment of the present invention.

FIG. 11 is a flowchart illustrating another method 750, in accordance with one or more exemplary embodiments. Method 750 may include receiving each of a primary phase modulated signal, a leading phase modulated signal, and a lagging phase modulated signal (depicted by numeral 752). Method 750 may also include combining the secondary phase modulated signal and the primary phase modulated signal to generate the output signal (depicted by numeral 754).

Figure 12:
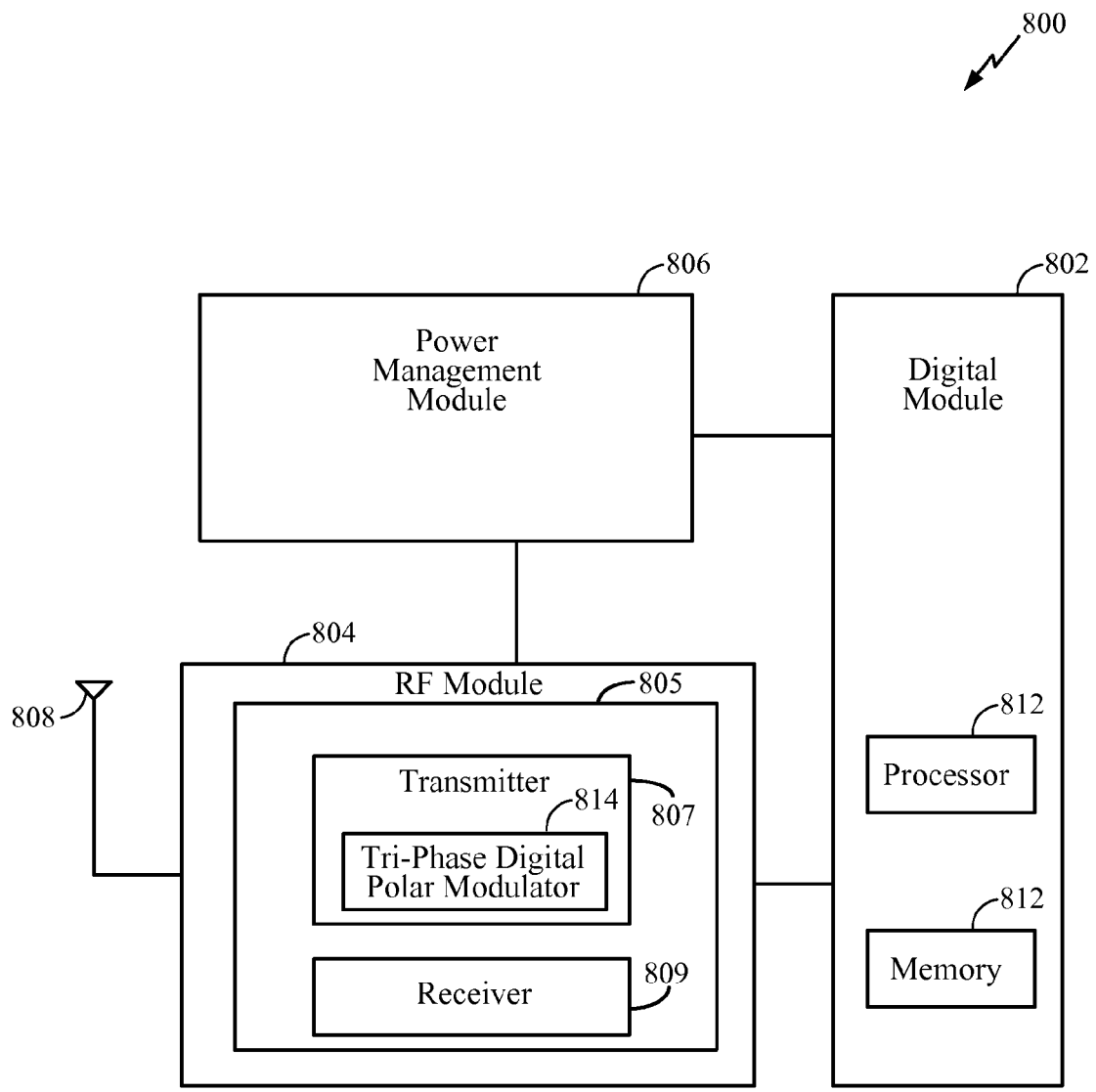
FIG. 12 is a block diagram of an electronic device according to an exemplary embodiment of the present invention.

FIG. 12 is a block diagram of an electronic device 800, according to an exemplary embodiment of the present invention. According to one example, device 800 may comprise a portable electronic device, such as a mobile telephone. Device 800 may include various modules, such as a digital module 802, an RF module 804, and a power management module 806. Digital module 802 may comprise one or more processors 810 and memory 812. RF module 804, which may comprise RF circuitry, may include a transceiver 805 including a transmitter 807 and a receiver 809 and may be configured for bi-directional wireless communication via an antenna 808. In general, wireless communication device 800 may include any number of transmitters and any number of receivers for any number of communication systems, any number of frequency bands, and any number of antennas. Further, according to an exemplary embodiment of the present invention, RF module 804 may include one or more tri-phase digital polar modulators 814, which may comprise, for example only, device 100 or device 650, as described herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
a modulator configured to generate a primary phase modulated signal including most significant bits (MSBs) of a modulated signal, a leading phase modulated signal including a first least significant bits (LSB) of the modulated signal, and a lagging phase modulated signal including a second LSB of the modulated signal; and
a combination unit having an input coupled to an output of the modulator, the combination unit configured to add the primary phase modulated signal, the leading phase modulated signal, and the lagging phase modulated signal.

2. The device of claim 1, the combination unit configured to add one or more control bits of the primary phase modulated signal.

3. The device of claim 1, wherein the leading phase modulated signal and the lagging phase modulated signal are offset with respect to the primary phase modulated signal in different directions and substantially equally offset amounts.

4. The device of claim 1, wherein the leading phase modulated signal and the lagging phase modulated signal are offset with respect to the primary phase modulated signal in different directions and different offset amounts.

5. The device of claim 1, the modulator configured to substantially simultaneously convey the primary phase modulated signal, the leading phase modulated signal, and the lagging phase modulated signal to the combination unit.

6. The device of claim 1, the combination unit comprising:
a first path for receiving the leading phase modulated signal;
a second path for receiving the lagging phase modulated signal; and
one or more additional paths for receiving the primary phase modulated signal.

7. The device of claim 1, wherein the combination unit generates an output signal and the output signal is coupled to an antenna.

8. The device of claim 1, wherein the combination unit comprises a plurality of capacitors.

9. The device of claim 8, wherein the plurality of capacitors are selectively switched between a supply voltage and ground.

10. The device of claim 8, wherein the plurality of capacitors comprise at least one capacitor configured by the leading phase modulated signal, at least one capacitor configured by the lagging phase modulated signal, and one or more capacitors configured by the primary phase modulated signal.

11. The device of claim 8, wherein the plurality of capacitors are coupled to a terminal of an inductor, and wherein a second terminal of the inductor is coupled to an antenna.

12. A device, comprising:
a phase modulator configured to convey a primary phase modulated signal including most significant bits (MSBs), a leading phase modulated signal including a first least significant bits (LSB), and a lagging phase modulated signal including a second LSB; and
a combination unit including a first path for receiving the leading phase modulated signal, and a second path for receiving the lagging phase modulated signal, and one or more additional paths for receiving the primary phase modulated signal, the combination unit configured to add the leading phase modulated signal, the lagging phase modulated signal, and at least one bit of the primary phase modulated signal.

13. The device of claim 12, the phase modulator comprising one of an analog phase modulator, a digital phase modulator, a phase modulator including a phase interpolator, and a sigma-delta phase modulator.

14. The device of claim 12, wherein the leading phase modulated signal and the lagging phase modulated signal are offset with respect to the primary phase modulated signal in different directions and one of substantially equally offset amounts and different offset amounts.

15. The device of claim 12, wherein at least one of the LSBs is an oversized LSB.

16. The device of claim 12, wherein the combination unit comprises a plurality of capacitors selectively switched between a supply voltage and ground.

17. A method, comprising:
generating a primary phase modulated signal including most significant bits (MSBs) of a signal;
generating a leading phase modulated signal including a first least significant bit (LSB) of the signal;
generating a lagging phase modulated signal including a second LSB of the signal; and
combining at least one bit of the primary phase modulated signal, the leading phase modulated signal, and the lagging phase modulated signal to generate an output signal.

18. The method of claim 17, wherein generating a leading phase modulated signal comprises generating a phase modulated signal that is offset with respect to the primary phase modulated signal in a first direction and the generating a lagging phase modulated signal comprises generating a phase modulated signal that is offset with respect to the primary phase modulated signal in a second, opposite direction.

19. The method of claim 17, wherein generating a leading phase modulated signal and generating a lagging phase modulated signal comprises generating the leading phase modulated signal and the lagging phase modulated signal having substantially equal offset with respect to the primary phase modulated signal and in different directions.

20. The method of claim 17, wherein generating a leading phase modulated signal and generating a lagging phase modulated signal comprises generating the leading phase modulated signal and the lagging phase modulated signal having unequal offset with respect to the primary phase modulated signal and in different directions.

21. The method of claim 17, wherein generating a leading phase modulated signal and generating a lagging phase modulated signal comprises generating the leading phase modulated signal and the lagging phase modulated signal having oversized bits.

22. The method of claim 17, wherein at least one of generating a leading phase modulated signal and generating a lagging phase modulated signal comprises generating an oversized LSB.

23. The method of claim 17, wherein generating a primary phase modulated signal comprises generating the primary modulated signal including an amplitude offset from an oversized LSB.

24. The method of claim 17, wherein the output signal is coupled to an antenna.

25. The method of claim 17, wherein the combining selectively switches a plurality of capacitors between a supply voltage and ground.

26. The method of claim 25, wherein at least one capacitor of the plurality of capacitors is configured by the leading phase modulated signal, at least one capacitor of the plurality of capacitors is configured by the lagging phase modulated signal, and one or more capacitors of the plurality of capacitors is configured by the primary phase modulated signal.

27. The method of claim 25, wherein the plurality of capacitors are coupled to a terminal of an inductor, and wherein a second terminal of the inductor is coupled to an antenna.

28. A method, comprising:
receiving each of a primary phase modulated signal, a leading phase modulated signal, and a lagging phase modulated signal; and
combining at least one bit of the primary phase modulated signal, the leading phase modulated signal, and the lagging phase modulated signal to generate an output signal, wherein the receiving comprising receiving the primary phase modulated signal comprising two most significant bits (MSBs) of a modulated signal, the leading phase modulated signal comprising a first least significant bit (LSB) of the modulated signal, and the lagging phase modulated signal comprising a second LSB of the modulated signal.

29. The method of claim 28, the combining comprising:
combining the leading phase modulated signal and the lagging phase modulated signal to generate a secondary phase modulated signal; and
combining the secondary phase modulated signal and the primary phase modulated signal to generate the output signal.

30. The method of claim 28, the receiving comprising receiving the primary phase modulated signal, the leading phase modulated signal, and the lagging phase modulated signal from a phase modulator.

31. The method of claim 28, the receiving comprising receiving the primary phase modulated signal, the leading phase modulated signal offset in a first direction from the primary modulated signal, and the lagging phase modulated signal offset in a second, opposite direction from the primary modulated signal.

32. The method of claim 28, further comprising conveying the output signal to an antenna.

33. A device, comprising:
means for generating a primary phase modulated signal including most significant bits (MSBs) of a signal,
for generating a leading phase modulated signal including a first least significant bit (LSB) of the signal, and
for generating a lagging phase modulated signal including a second LSB of the signal; and
means for combining at least one bit of the primary phase modulated signal, the leading phase modulated signal, and the lagging phase modulated signal to generate an output signal.

* * * * *